United States Patent
Reddy

(10) Patent No.: US 9,729,117 B2
(45) Date of Patent: Aug. 8, 2017

(54) SYSTEM AND METHOD FOR LEAKAGE CURRENT CONTROL FOR PROGRAMMABLE GAIN AMPLIFIERS

(71) Applicant: Conexant Systems, LLC, Irvine, CA (US)

(72) Inventor: Chandrashekar Reddy, Patancheru (IN)

(73) Assignee: Conexant Systems, LLC, Irvine, CA (US)

( * ) Notice: Subject to any disclaimer, the term of this patent is extended or adjusted under 35 U.S.C. 154(b) by 0 days.

(21) Appl. No.: 14/741,352

(22) Filed: Jun. 16, 2015

(65) Prior Publication Data

US 2015/0365051 A1    Dec. 17, 2015

Related U.S. Application Data

(60) Provisional application No. 62/012,950, filed on Jun. 16, 2014.

(51) Int. Cl.
| | |
|---|---|
| H03G 3/30 | (2006.01) |
| H03F 3/45 | (2006.01) |
| H03G 1/00 | (2006.01) |
| H03G 1/04 | (2006.01) |
| H03G 3/00 | (2006.01) |

(52) U.S. Cl.
CPC ............ *H03G 3/30* (2013.01); *H03F 3/45475* (2013.01); *H03F 3/45771* (2013.01); *H03G 1/0088* (2013.01); *H03G 1/04* (2013.01); *H03G 3/001* (2013.01); *H03F 2200/129* (2013.01); *H03F 2203/45212* (2013.01); *H03F 2203/45528* (2013.01); *H03F 2203/45591* (2013.01); *H03F 2203/45594* (2013.01); *H03F 2203/45616* (2013.01)

(58) Field of Classification Search
CPC ........ H03G 3/30; H03G 3/00; H03F 3/45475; H03F 3/45771; H03F 2200/129; H03F 2203/45212; H03F 2203/45528; H03F 2203/45591; H03F 2203/45594; H03F 2203/45616; H03K 5/00; G06G 7/18
USPC .... 330/9, 144, 254, 278, 282, 284; 307/493, 307/491; 328/127
See application file for complete search history.

(56) References Cited

U.S. PATENT DOCUMENTS

2015/0280668 A1* 10/2015 Huang ................ H03G 1/0088
330/254

* cited by examiner

*Primary Examiner* — Steven J Mottola
*Assistant Examiner* — Hafizur Rahman
(74) *Attorney, Agent, or Firm* — Haynes and Boone, LLP

(57) ABSTRACT

A system that utilizes an amplified signal is disclosed that includes a plurality of first switches coupled to a plurality of first impedances. A plurality of second switches coupled to a plurality of second impedances. An amplifier having a first input coupled to the plurality of first switches and a second input coupled to the plurality of second switches. A leakage current offset source coupled to the first input of the amplifier, wherein the leakage current offset source cancels a leakage current component of a first current provided from the plurality of first switches to the first input.

15 Claims, 5 Drawing Sheets

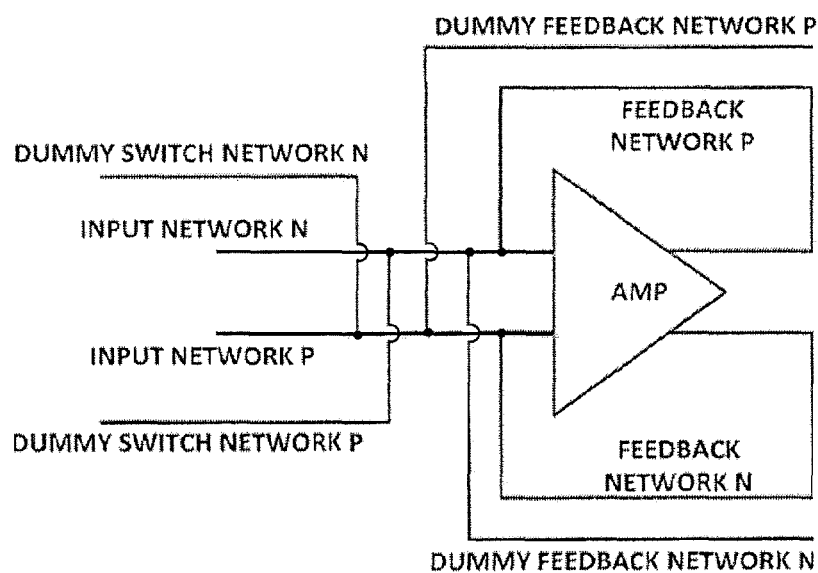

SYSTEM AND METHOD FOR LEAKAGE CURRENT CONTROL FOR PROGRAMMABLE GAIN AMPLIFIERS

CROSS-REFERENCE TO RELATED APPLICATION

This application is a non-provisional of and claims priority to and the benefit of U.S. Provisional Patent Application No. 62/012,950 filed on Jun. 16, 2014, which is incorporated herein by reference in its entirety.

TECHNICAL FIELD

The present disclosure relates generally to programmable gain amplifiers, and more specifically to a system and method for leakage current control for programable gain amplifiers.

BACKGROUND

Programmable gain amplifiers have problems with leakage current that impact total harmonic distortion, crosstalk and other metrics that prevent programmable gain amplifiers from being used in many applications.

SUMMARY

A system that utilizes an amplified signal is disclosed that includes a plurality of first switches coupled to a plurality of first impedances, such as for a positive input to a programmable gain amplifier. A plurality of second switches is coupled to a plurality of second impedances, such as for a negative input to a programmable gain amplifier. An amplifier having a first input coupled to the plurality of first switches and a second input coupled to the plurality of second switches is used to amplify a signal. A leakage current offset source is coupled to the first input of the amplifier, such as a dummy switch matrix that is disposed adjacent to the plurality of second switches, wherein the leakage current offset source cancels a leakage current component of a first current that is provided from the plurality of first switches to the first input.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION

Figure 1:
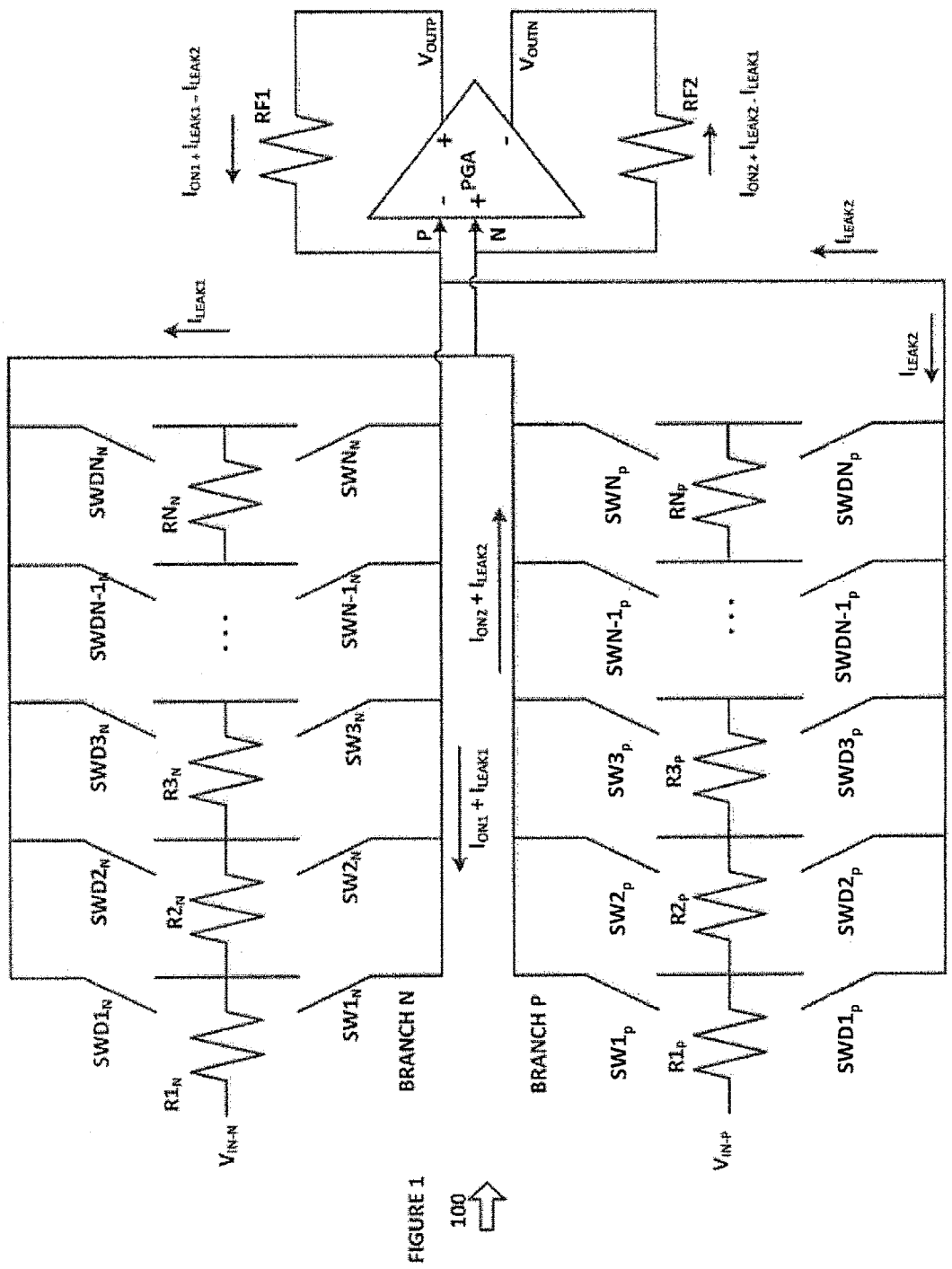
FIG. 1 is a diagram of a circuit of a PGA with a dummy switch matrix, in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

Programmable gain amplifiers (PGAs) can be used to increase the strength of an incoming signal before it is provided to a filtering stage or for other suitable purposes. The gain control for PGA can be implemented by two sets of variable impedances, one at the input terminals and the other as the feedback of the amplifier between the input terminals and the output terminals. The impedance can be varied by switches that control the impedance between the terminals. In this manner, different combinations of input and feedback impedances can be achieved, leading to a wide range in gain. To ensure linearity in gain across input voltage, it is necessary to ensure proper matching between the switches that are used in the input and feedback matrix.

For example, as supply voltages decrease, the threshold voltages of switches that are configured for those supply voltages also decrease, which increases the magnitude of leakage currents in the OFF state. While leakage current effects may be tolerable in other applications, they must be reduced considerably for PGAs, because such leakage signals can reduce the accuracy of the signal integrity. The leakage current $I_{OFF}$ may be influenced by the threshold voltage, the physical dimensions of the channel and its doping profile, the supply voltage, gate-oxide thickness and other design variables. Leakage mechanisms include currents flowing at sub-threshold gate voltages, due to hot-carrier injection channel punch through, as well as other non-linear effects.

Because of the non-linear behavior of the switch devices, leakage currents can arise and can impede performance by introducing cross-talk phenomena and increasing harmonic distortion. The present disclosure counters the effects of leakage currents, thereby improving performance of the PGA.

Total harmonic distortion caused by leakage current results from the weak inversion current (Ileak) resulting from sub-threshold conduction, which is given by the equation:

$$I_{ds} = \mu_0 C_{ox} \frac{W}{L}(m-1)v_T^2 e^{\frac{V_g - V_{th}}{m v_T}} \left(1 - e^{\frac{-v_{DS}}{v_T}}\right) \quad (1)$$

where $$m = 1 + \frac{C_{dm}}{C_{ox}} = 1 + \frac{\frac{\epsilon_{si}}{W_{dm}}}{\frac{\epsilon_{ox}}{t_{ox}}} = 1 + \frac{3 t_{ox}}{W_{dm}}$$

As can be seen in these equations, the leakage current Ileak varies non-linearly with Vgs. This effect renders the relationship between input voltage and switch current non-linear, causing gain to vary non-linearly with respect to input voltage. As a result, harmonic distortion is introduced and performance suffers.

The total current that flows in the input branch is a combination of ON current and leakage current. For example if SW1 is on, the on current $I_{ON} = V_{IN}/R1$, and the leakage current Ileak equals the leakage current from all of the other switches that are in an OFF state.

Crosstalk from other inputs can also be caused by leakage currents. Channel cross-talk is caused due to off-state leakage current in the other paths. Even when switches are in an off state, in PGAs with parallel input branches, a second parallel input branch will leak a sub-threshold current to a first parallel input branch in the OFF state as well. This configuration can result in the second parallel branch providing a conducting path for the signal to the first parallel branch and vice-versa, which can result in channel crosstalk.

FIG. 1 is a diagram of a circuit 100 of a PGA with a dummy switch matrix, in accordance with an exemplary embodiment of the present disclosure. Circuit 100 eliminates the effects of leakage current by using a symmetrical design that incorporates dummy switches.

Circuit 100 includes a programmable gain amplifier PGA that includes two input branches. Branch N is coupled to input voltage $V_{IN-N}$ and PGA input P, and branch P is coupled to input voltage $V_{IN-P}$ and PGA input N. In the input branches, a series of resistors $R1_N$ to $RN_N$ and $R1_P$ to $RN_P$ is coupled to the inputs to the PGA with a corresponding series of switches $SW1_N$ through $SWN_N$ and $SW1_P$ through $SWN_P$, as well as a corresponding series of dummy switches $SWD1_N$ through $SWDN_N$ and $SWD1_P$ through $SWDN_P$. Leakage current $I_{LEAK1}$ is conducted through dummy switches $SWD1_N$ through $SWDN_N$, and leakage current $I_{LEAK2}$ is conducted through dummy switches $SWD1_P$ through $SWDN_P$.

In this manner, the dummy switch matrix negates the leakage current flowing through the existing switches. The additional leakage current in the dummy switch matrix is added to the current through the existing switches in such a way that voltage drop due to leakage is cancelled at the output. The differential voltage at the output of the differential amplifier is given by:

$$Vout = (Voutp - Voutn)$$
$$= (I_{ON1} + I_{LEAK1} - I_{LEAK2}) * RF1 + (I_{ON2} + I_{LEAK2} - I_{LEAK1}) * RF2$$
$$\geq (I_{ON1} + I_{ON2}) * RF$$

The dimensions and electrical parameters of the added switches should match those of the existing switches in order to achieve perfect cancellation.

The present disclosure does not result in consumption of a significant amount of excess current or power by the PGA, by virtue of it being a symmetrical design, and improves the total harmonic distortion and crosstalk significantly, which otherwise would require limiting the input and output signal swings.

Figure 2:
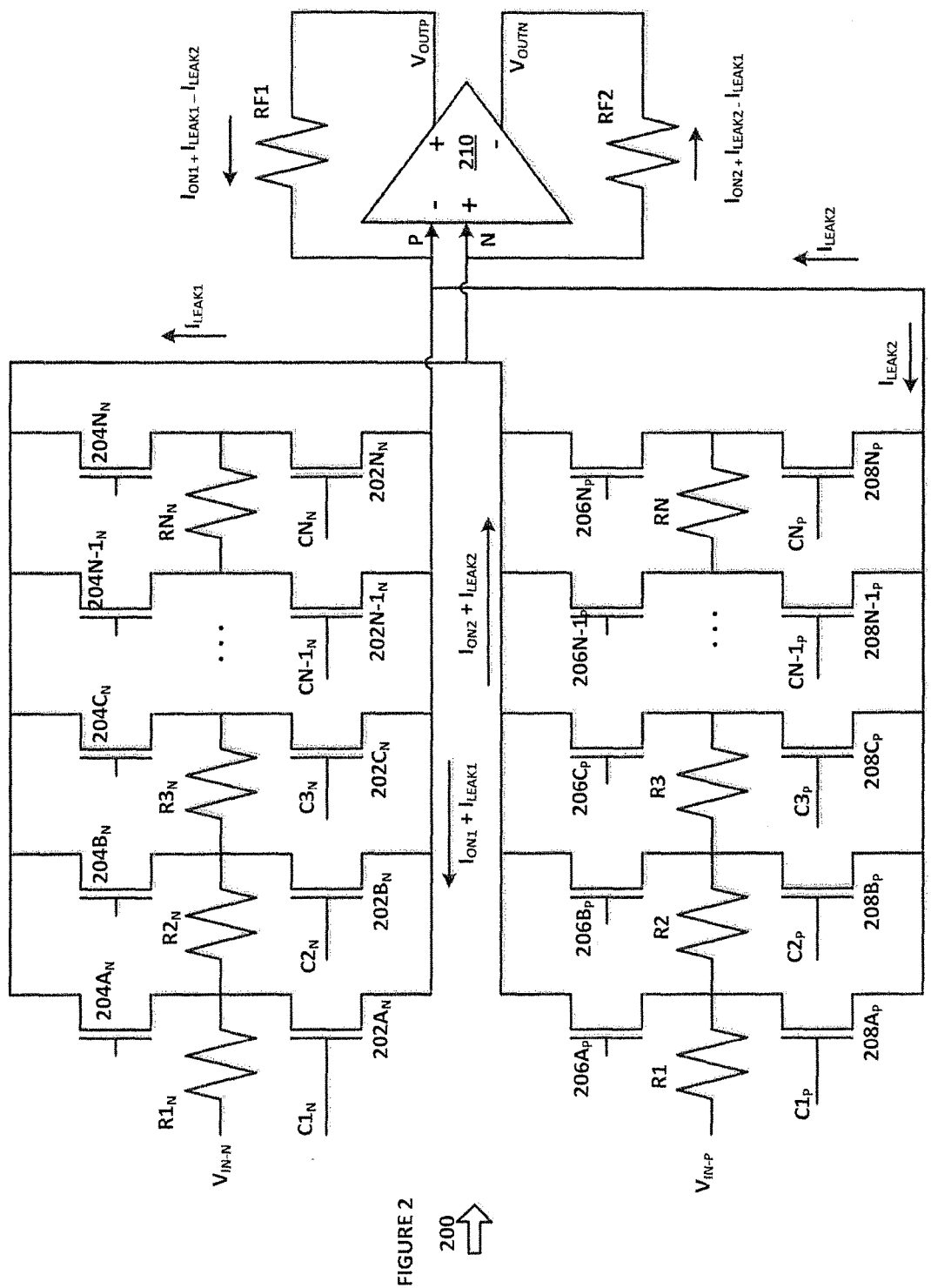
FIG. 2 is a diagram of a circuit of a PGA with a dummy switch matrix, in accordance with an exemplary embodiment of the present disclosure.

FIG. 2 is a diagram of a circuit 200 of a PGA with a dummy switch matrix, in accordance with an exemplary embodiment of the present disclosure. Circuit 200 eliminates the effects of leakage current by using a symmetrical design that incorporates dummy switches.

Circuit 200 includes dummy transistors $204A_N$ through $204N_N$ and $206A_P$ through $206N_P$, and active transistors $202A_N$ through $202N_N$ and $208A_P$ through $208N_P$. The active transistors $202A_N$ through $202N_N$ and $208A_P$ through $208N_P$ receive control signals $C1_N$ through $CN_N$ and $C1_P$ through $CN_P$, respectively, whereas dummy transistors $204A_N$ through $204N_N$ and $206A_P$ through $206N_P$ do not receive a control signal, because they are only present to generate leakage current to offset the leakage current of the active transistors, and are not operated. In this manner, the current provided to the + and − inputs to PGA 210 includes leakage current components that are approximately opposite, and which thus cancel out. The active and dummy transistors can be CMOS transistors or devices, BJTs or other suitable transistors or switch devices, but the circuit characteristics and design of the dummy and active transistors should be as similar as possible, so as to result in leakage current that is essentially identical for all devices.

Figure 3:
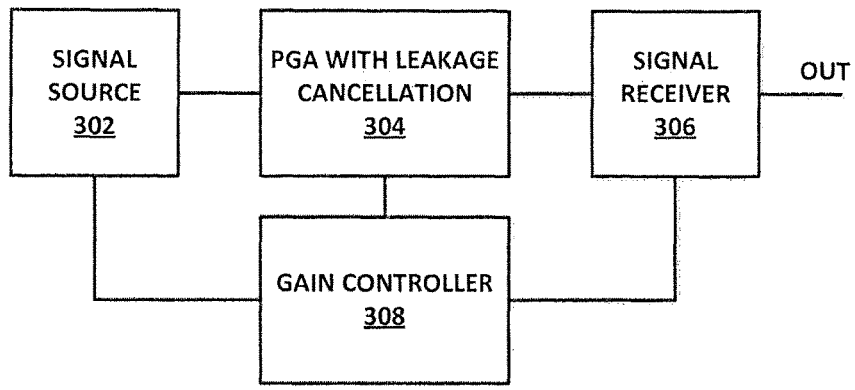
FIG. 3 is a diagram of a system for controlling a PGA with leakage cancellation in accordance with an exemplary embodiment of the present disclosure.

FIG. 3 is a diagram of a system 300 for controlling a PGA with leakage cancellation in accordance with an exemplary embodiment of the present disclosure. System 300 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

Signal source 302 is coupled to PGA with leakage cancellation 304 and generates an output. In one exemplary embodiment, signal source 302 can generate an audio data signal from an audio data file, a microphone or other suitable audio data source. In another exemplary embodiment, signal source 302 can be a motor controller or other suitable signal sources.

PGA with leakage cancellation 304 is coupled to signal source 302, signal receiver 306 and gain controller 308, and amplifies the signal received from signal source 302 using leakage current cancellation from dummy transistors or other suitable sources. The amplified high quality signal is then provided to signal receiver 306.

Signal receiver 306 is coupled to PGA with leakage cancellation 304 and gain controller 308, and processes the amplified signal from PGA with leakage cancellation 304. In one exemplary embodiment, signal receiver 306 can generate a control signal for gain controller 308 to increase or decrease the signal generated by PGA with leakage cancellation 304, such as to increase the signal if it is too weak or to reduce the signal if it contains too much distortion or is too large.

Gain controller 308 is coupled to signal source 302, PGA with leakage cancellation 304 and signal receiver 306, and generates a gain control signal for PGA with leakage cancellation 304 based on the signal received from signal source 302 and signal receiver 306. In one exemplary embodiment, gain controller 308 can increase a gain or decrease a gain as a function of a leakage current effect, such as total harmonic distortion or crosstalk, such as to increase or decrease gain until total harmonic distortion or cross talk reaches a predetermined threshold.

In operation, system 300 allows a PGA with improved leakage current control to be used in an application where minimized leakage current effects are important to operation, such as for processing audio signals, signal processing or other suitable applications. System 300 allows input signals to be amplified to a level that is higher than would otherwise be possible by controlling the effects of leakage current, and also improves the fidelity of signal amplification.

Figure 4:
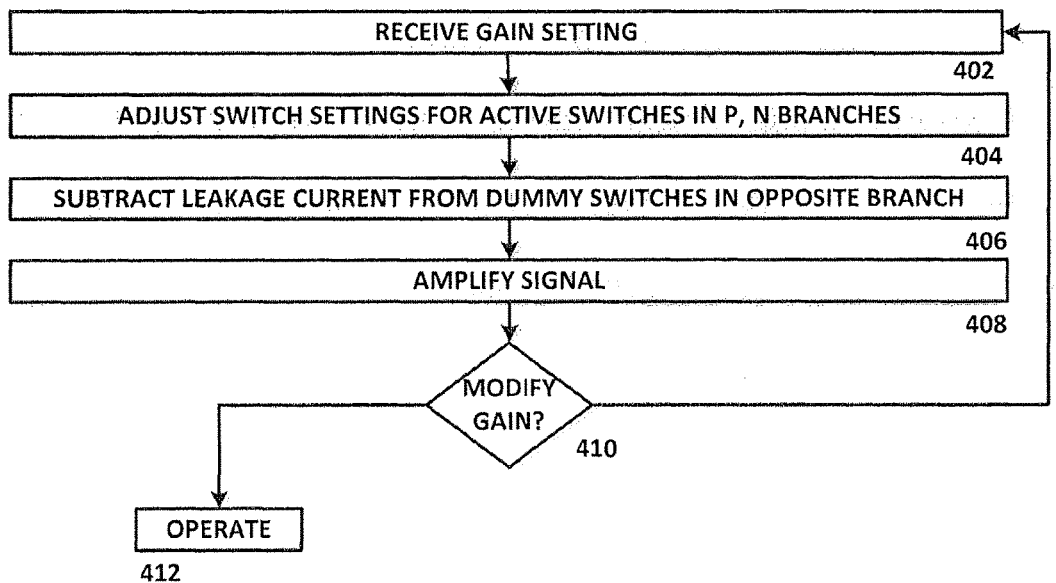
FIG. 4 is a diagram of an algorithm for controlling leakage current in a programmable gain amplifier or other suitable applications, in accordance with an exemplary embodiment of the present disclosure.

FIG. 4 is a diagram of an algorithm 400 for controlling leakage current in a programmable gain amplifier or other suitable applications, in accordance with an exemplary embodiment of the present disclosure. Algorithm 400 can be implemented in hardware or a suitable combination of hardware and software, and can be implemented using discrete analog devices.

Algorithm 400 begins at 402, where a gain setting for a programmable gain amplifier is received. In one exemplary embodiment, the gain setting can indicate an increase or decrease in a number of settings from a current setting for the programmable gain amplifier, can be a relative gain setting (such as 50% of maximum, 25% of maximum and so forth), or other suitable gain settings can be used. The algorithm then proceeds to 404.

At 404, the gain setting can be used to select one or more switch settings for a plurality of switches in P and N branches of an input network to a programmable gain amplifier, one or more switches in a feedback network or other suitable settings. The algorithm then proceeds to 406.

At 406, leakage current from dummy switches in each branch is subtracted from the current in another branch. In one exemplary embodiment, the leakage current from one branch can be subtracted from the total current in a second branch, such as by coupling a first conductor to a second conductor at the input to a programmable gain amplifier, either directly or using one or more switches. The algorithm then proceeds to 408, where the signal is amplified, such as using the ratio of input impedance and feedback impedance or in other suitable manners. The algorithm then proceeds to 410.

At 410, it is determined whether the gain needs to be modified. If the gain does not need to be modified, the algorithm proceeds to 412 where the programmable gain amplifier is operated at its current setting. Otherwise, the algorithm returns to 402, where a new gain setting is received.

In operation, algorithm 400 controls the effect of leakage current in a programmable gain amplifier by cancelling leakage current from a set of dummy switches or in other suitable manners, to result in an amplified signal that has lower total harmonic distortion and reduced crosstalk. Algorithm 400 that allows a signal to be amplified at a higher fidelity, and enables applications for programmable gain amplifiers that would otherwise not be possible, such as high fidelity audio processing.

Figure 5:
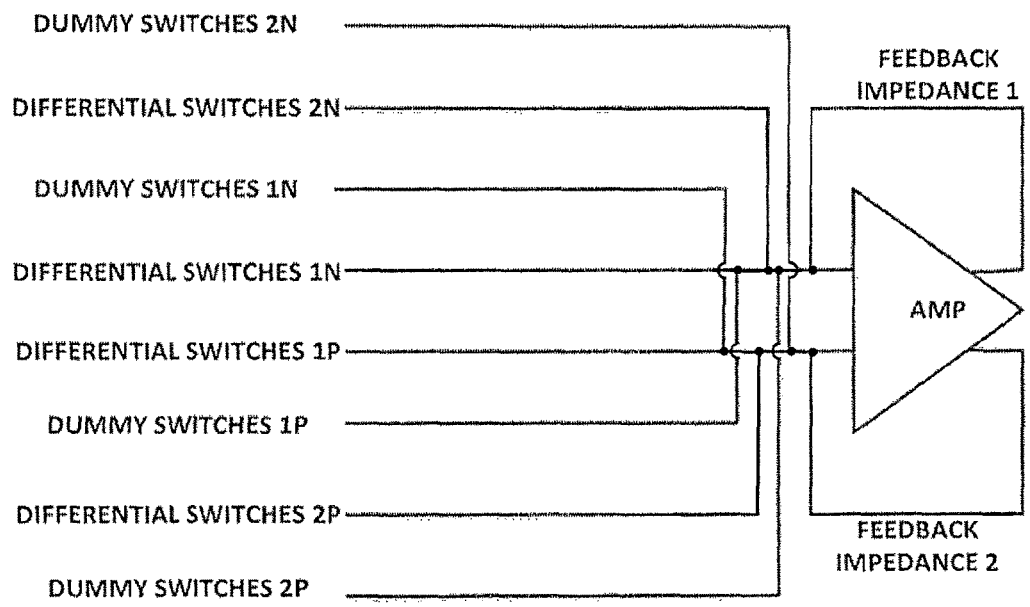
FIG. 5 is a diagram of a system for amplifying a signal in accordance with an exemplary embodiment of the present disclosure.

FIG. 5 is a diagram of a system 500 for amplifying a signal in accordance with an exemplary embodiment of the present disclosure. System 500 can be implemented in hardware or a suitable combination of hardware and software, and can include a plurality of discrete or integrated analog devices.

System 500 includes two differential inputs: 1) differential switches 1N and differential switches 1P, and 2) differential switches 2N and differential switches 2P. Each set of differential switches has associated impedances for use with feedback impedance 1 and feedback impedance 2, to control a gain of amplifier AMP. In addition, system 500 includes dummy switches 1N, dummy switches 2N, dummy switches 1P and dummy switches 2P, which are cross connected to the inputs of AMP to control the effects of leakage current and crosstalk, as previously discussed. In this manner, the leakage current for a PGA or other devices with multiple differential inputs and associated switch networks can be controlled by offsetting the leakage current with an approximately equivalent and opposite leakage current from a dummy switch network.

Figure 6:
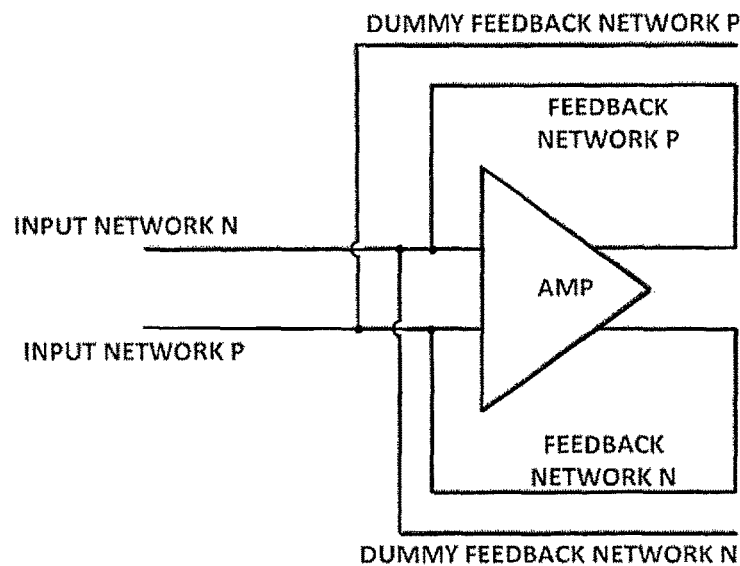
FIG. 6 is a diagram of a system for amplifying a signal in accordance with an exemplary embodiment of the present disclosure.

FIG. 6 is a diagram of a system 600 for amplifying a signal in accordance with an exemplary embodiment of the present disclosure. System 600 can be implemented in hardware or a suitable combination of hardware and software, and can include a plurality of discrete or integrated analog devices.

System 600 includes input network N and input network P, which are switch networks with associated impedances for controlling a gain of amplifier AMP in conjunction with the impedance of feedback network N and feedback network P. In addition, dummy feedback network N and dummy feedback network P are cross-connected to control leakage current by offsetting the leakage current with an approximately equivalent and opposite leakage current from a dummy switch network, in the manner previously discussed.

Figure 7:
FIG. 7 is a diagram of a system for amplifying a signal in accordance with an exemplary embodiment of the present disclosure.

FIG. 7 is a diagram of a system 700 for amplifying a signal in accordance with an exemplary embodiment of the present disclosure. System 700 can be implemented in hardware or a suitable combination of hardware and software, and can include a plurality of discrete or integrated analog devices.

System 700 includes input network N and input network P, which are switch networks with associated impedances for controlling a gain of amplifier AMP in conjunction with the impedance of feedback network N and feedback network P. In addition, dummy switch network N and dummy switch network P are used to generate offsetting leakage currents to control the leakage current in input network P and input network N, respectively. Furthermore, dummy feedback network N and dummy feedback network P are cross-connected at the inputs to AMP to control leakage current by offsetting the leakage current with an approximately equivalent and opposite leakage current from a dummy switch network, in the manner previously discussed. Although a single differential input is shown in system 700, multiple differential inputs can also or alternatively be used.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system that utilizes an amplified signal, comprising:
    a plurality of first switches coupled to a plurality of first impedances;
    a plurality of second switches coupled to a plurality of second impedances;
    an amplifier having a first input coupled to the plurality of first switches and a second input coupled to the plurality of second switches; and
    a leakage current offset source coupled to the first input of the amplifier, wherein the leakage current offset source cancels a leakage current component of a first current provided from the plurality of first switches to the first input;
    wherein the plurality of first switches coupled to the plurality of first impedances and the plurality of second switches coupled to the plurality of second impedances comprises a first differential input, and further comprising a second differential input.

2. The system of claim 1 further comprising a second leakage current offset source coupled to the second input of the amplifier, wherein the second leakage current offset source cancels a leakage current component of a second current provided from the plurality of second switches to the first input.

3. The system of claim 1 wherein the plurality of first switches further comprises a feedback network coupled to the first input of the amplifier and a first output of the amplifier.

4. The system of claim 1 wherein the leakage current offset source comprises a plurality of third switches disposed adjacent to the plurality of second switches.

5. The system of claim 1 further comprising a second leakage current offset source coupled to the second input of the amplifier, wherein the second leakage current offset source cancels a leakage current component of a second current provided from the plurality of second switches to the second input.

6. The system of claim 1 further comprising a controller coupled to the plurality of first switches and configured to control a setting of each of the plurality of first switches to control a gain of the amplifier.

7. The system of claim 1, wherein the leakage current offset source cancels a leakage current component of a second current provided from the second differential input.

8. A system that utilizes an amplified signal, comprising:
    a plurality of first switches coupled to a plurality of first impedances;
    a plurality of second switches coupled to a plurality of second impedances;
    an amplifier having a first input coupled to the plurality of first switches and a second input coupled to the plurality of second switches;
    a plurality of third switches coupled to the first input of the amplifier, wherein a leakage current from the plurality of third switches cancels a leakage current component of a first current provided from the plurality of first switches to the first input; and
    a fourth plurality of switches coupled to the second input of the amplifier, wherein a leakage current from the fourth plurality of switches cancels a leakage current component of a second current provided from the plurality of second switches to the second input.

9. The system of claim 8 wherein the plurality of first switches further comprises a feedback network coupled to the first input of the amplifier and a first output of the amplifier.

10. The system of claim 8 wherein the third plurality of switches comprises a plurality of third switches disposed adjacent to the plurality of second switches.

11. The system of claim 8 further comprising a fourth plurality of switches coupled to the second input of the amplifier, wherein a leakage current of the fourth plurality of switches cancels a leakage current component of a second current provided from the plurality of second switches to the second input.

12. The system of claim 8 further comprising a controller coupled to the plurality of first switches and configured to control a setting of each of the plurality of switches to control a gain of the amplifier.

13. A system that utilizes an amplified signal, comprising:
    a plurality of first switches coupled to a plurality of first impedances;
    a plurality of second switches coupled to a plurality of second impedances;
    an amplifier having a first input coupled to the plurality of first switches and a second input coupled to the plurality of second switches;
    a plurality of third switches coupled to the first input of the amplifier, wherein a leakage current from the plurality of third switches cancels a leakage current component of a first current provided from the plurality of first switches to the first input; and
    a fourth plurality of switches coupled to the second input of the amplifier, wherein a leakage current from the fourth plurality of switches cancels a leakage current component of a second current provided from the plurality of second switches to the second input;
    wherein the plurality of first switches coupled to the plurality of first impedances and the plurality of second switches coupled to the plurality of first impedances comprises a first differential input, and further comprising a second differential input.

14. The system of claim 13, wherein a leakage current of the third plurality of switches cancels a leakage current component of a second current provided from the second differential input.

15. A system that utilizes an amplified signal, comprising:
    a plurality of first switches coupled to a plurality of first impedances to form a first positive input to an amplifier;
    a plurality of first dummy switches disposed adjacent to the plurality of first switches and coupled to a first negative input to the amplifier;
    a plurality of second switches coupled to a plurality of second impedances to form a first negative input to the amplifier;

a plurality of second dummy switches disposed adjacent to the plurality of second switches and coupled to the first positive input to the amplifier;

a plurality of third switches coupled to a plurality of third impedances to form a second positive input to the amplifier;

a plurality of third dummy switches disposed adjacent to the plurality of third switches and coupled to a second negative input to the amplifier;

a plurality of fourth switches coupled to a plurality of fourth impedances to form the second negative input to the amplifier;

a plurality of fourth dummy switches disposed adjacent to the plurality of fourth switches and coupled to the second positive input to the amplifier;

the amplifier having a positive input coupled to the first positive input and the second positive input and a negative input coupled to the first negative input and the second negative input;

a first feedback network coupled to a first output of the amplifier and the positive input of the amplifier;

a first dummy feedback network disposed adjacent to the first feedback network and coupled to the negative input of the amplifier;

a second feedback network coupled to a second output of the amplifier and the negative input of the amplifier;

a second dummy feedback network disposed adjacent to the second feedback network and coupled to the positive input of the amplifier; and a controller coupled to the plurality of first switches, the plurality of second switches, the plurality of third switches, the plurality of fourth switches, the first feedback network and the second feedback network and configured to control a setting of each of the plurality of first switches the plurality of second switches, the plurality of third switches, the plurality of fourth switches, the first feedback network and the second feedback network to control a gain of the amplifier.

\* \* \* \* \*